(12) United States Patent
Scheuerlein et al.

(10) Patent No.: US 7,474,000 B2
(45) Date of Patent: Jan. 6, 2009

(54) HIGH DENSITY CONTACT TO RELAXED GEOMETRY LAYERS

(75) Inventors: Roy E Scheuerlein, Cupertino, CA (US); Christopher J Petti, Mountain View, CA (US)

(73) Assignee: Sandisk 3D LLC, Milpitas, CA (US)

( * ) Notice: Subject to any disclaimer, the term of this patent is extended or adjusted under 35 U.S.C. 154(b) by 0 days.

(21) Appl. No.: 10/728,451

(22) Filed: Dec. 5, 2003

(65) Prior Publication Data

US 2005/0127519 A1 Jun. 16, 2005

(51) Int. Cl.
*H01L 23/48* (2006.01)

(52) U.S. Cl. .................. 257/758; 257/776; 438/668; 438/672

(58) Field of Classification Search ............ 257/758, 257/776; 438/637, 668, 672, 675
See application file for complete search history.

(56) References Cited

U.S. PATENT DOCUMENTS

| | | | |
|---|---|---|---|
| 5,835,396 A | 11/1998 | Zhang | |
| 6,034,436 A * | 3/2000 | Iwasaki | 257/774 |
| 6,034,882 A | 3/2000 | Johnson et al. | |
| 6,185,121 B1 | 2/2001 | O'Neill | |
| 6,429,529 B1 * | 8/2002 | Keeth | 257/776 |
| 6,822,330 B2 * | 11/2004 | Park et al. | 257/758 |
| 7,307,012 B2 | 12/2007 | Cleeves | |
| 2001/0038115 A1 * | 11/2001 | Amanuma | 257/303 |
| 2002/0079553 A1 | 6/2002 | Cleeves | |
| 2002/0195700 A1 * | 12/2002 | Li | 257/700 |
| 2003/0178726 A1 * | 9/2003 | Ogawa et al. | 257/758 |
| 2004/0061229 A1 * | 4/2004 | Moslehi | 257/758 |
| 2004/0084778 A1 * | 5/2004 | Hosoda et al. | 257/758 |
| 2004/0125629 A1 * | 7/2004 | Scheuerlein et al. | 365/17 |
| 2004/0266206 A1 * | 12/2004 | Cleeves | 438/719 |
| 2005/0017363 A1 * | 1/2005 | Lin et al. | 257/758 |

OTHER PUBLICATIONS

Scheuerlein, Roy.E., et al. ,"A 10ns Read and Write Non-Volatile Memory Array Using a Magnetic Tunnel Junction and FET Switch in each Cell", *2000 IEEE International Solid-State Circuits Conference: ISSCC 2000*, Feb. 8, 2000: *Emerging Memory and Device Technologies/Paper TA 7.2*, (Feb. 8, 2000), 128-129.

* cited by examiner

*Primary Examiner*—Fernando L Toledo
(74) *Attorney, Agent, or Firm*—Dugan & Dugan, PC

(57) ABSTRACT

The present invention provides for a via and staggered routing level structure. Vertically overlapping vias connect to two or more routing levels formed at different heights. The routing levels are either both formed above or both formed below the vias, and all are formed above a semiconductor substrate wafer. In this way vias can be formed having a pitch smaller than the pitch of either the first routing level or the second routing level, saving space.

46 Claims, 12 Drawing Sheets

HIGH DENSITY CONTACT TO RELAXED GEOMETRY LAYERS

RELATED APPLICATIONS

This application is related to Cleeves et al., U.S. application Ser. No. 10/728,437, "Optimization of Critical Dimensions and Pitch of Patterned Features in and Above a Substrate," filed on even date herewith, which application is hereby incorporated by reference.

BACKGROUND OF THE INVENTION

The invention relates to a structure for providing electrical interconnection between levels formed at different heights in an integrated circuit, specifically to elements in a dense multilevel array.

It is known to form vias to electrically connect routing levels formed at different heights in an integrated circuit. In a conventional arrangement, shown in FIG. 1, bottom routing level $RL_1$ is formed first. Generally a dielectric material is deposited on $RL_1$. The dielectric material is selectively excavated to form a hole, which is then filled with a conductive material to form via $V_1$. In the same manner routing level $RL_2$ is formed above via $V_1$, via $V_2$ formed above routing level $RL_2$, and so on, alternating routing levels and vias providing electrical interconnection as required.

With the advent of extremely dense structures requiring extensive interconnection, including, for example, interconnection between layers that are not vertically adjacent, while the highest possible density must be maintained, this conventional arrangement uses space inefficiently and requires extra processing steps.

There is a need, therefore, to form vias between different levels in a dense array while using as little die area as possible.

SUMMARY OF THE INVENTION

The present invention is defined by the following claims, and nothing in this section should be taken as a limitation on those claims. In general, the invention is directed to a novel structure of vias and staggered routing levels adapted to provide electrical connection to a dense multilevel array.

A first aspect of the invention provides for a structure for providing multilevel electrical connectivity within an integrated circuit, the structure comprising a first plurality of vias; a second plurality of vias, wherein the first and second pluralities of vias are vertically overlapping; a first routing level at a first height, said first level connected to the first plurality of vias; and a second routing level at a second height, said second level connected to the second plurality of vias, wherein the first height is different from the second height, wherein both routing levels are formed above the substrate, and wherein a) the first routing level and the second routing level are above the first and second vias or b) the first routing level and the second routing level are below the first and second vias.

Another aspect of the invention provides for a structure for providing multilevel electrical connectivity within an integrated circuit, the structure comprising a first plurality of vias; a second plurality of vias, wherein the first and second pluralities of vias are vertically overlapping; a first routing level at a first height, said first level connected to the first plurality of vias; a second routing level at a second height, said second level connected to the second plurality of vias, wherein the first height is different from the second height; and a third routing level at a third height, the third level connected to the first plurality of vias and to the second plurality of vias, wherein all three routing levels are formed above the substrate.

A related aspect of the invention provides for a structure for providing multilevel electrical connectivity within an integrated circuit, the structure comprising a first plurality of vias; a second plurality of vias; a first routing level at a first height, said first level connected to the first plurality of vias; a second routing level at a second height, said second level connected to the second plurality of vias, wherein the first height is different from the second height; and a third routing level at a third height, the third level connected to the first plurality of vias and to the second plurality of vias, wherein all three routing levels are formed above the substrate, and wherein either the third routing level is above both the first and the second routing levels, or the third routing level is below both the first and the second routing levels.

Yet another aspect of the invention provides for a method for forming a via and routing structure for electrically connecting a multilevel array in an integrated circuit, the method comprising forming a first routing level; forming a second routing level above the first routing level; forming a first plurality of vias connected at bottom ends to the first routing level; forming a second plurality of vias connected at bottom ends to the second routing level, wherein the first and second pluralities of vias are vertically overlapping.

Each of the aspects and embodiments of the invention can be used alone or in combination with one another.

The preferred aspects and embodiments will now be described with reference to the attached drawings.

DETAILED DESCRIPTION OF THE INVENTION

Figure 1:
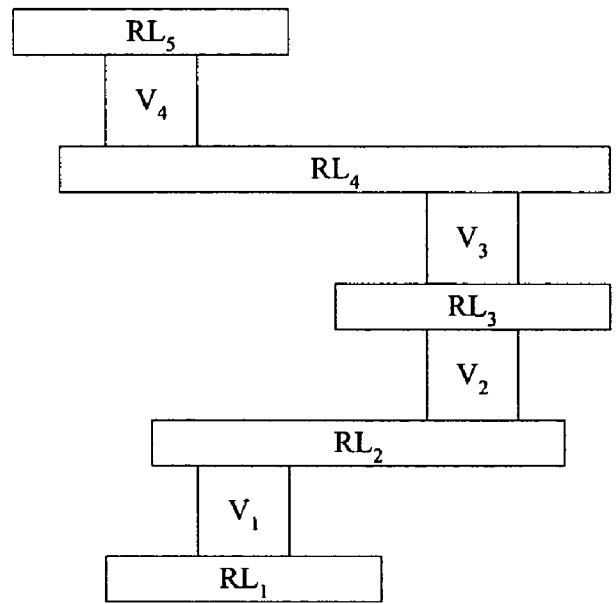
FIG. 1 is a cross-sectional view of a conventional routing-level-and-via arrangement used in prior art.

Monolithic three dimensional memory arrays are described in Johnson et al., U.S. Pat. No. 6,034,882, "Vertically stacked field programmable nonvolatile memory and method of fabrication"; Johnson, U.S. Pat. No. 6,525,953, "Vertically stacked field programmable nonvolatile memory and method of fabrication"; Knall et al., U.S. Pat. No. 6,420,215, "Three Dimensional Memory Array and Method of Fabrication"; Lee et al., U.S. patent application Ser. No. 09/927648, "Dense Arrays and Charge Storage Devices, and Methods for Making Same," filed Aug. 13, 2001; Herner, U.S. application Ser. No. 10/095962, "Silicide-Silicon Oxide-Semiconductor Antifuse Device and Method of Making," filed Mar. 13, 2002; Vyvoda et al., U.S. patent application Ser. No. 10/185507, "Electrically Isolated Pillars in Active Devices," filed Jun. 27, 2002; Herner et al., U.S. patent application Ser. No. 10/326470, "An Improved Method for Making High Density Nonvolatile Memory," filed Dec. 19, 2002; Walker et al., U.S. application Ser. No. 10/335089, "Method for Fabricating Programmable Memory Array Structures Incorporating Series-Connected Transistor Strings," filed Dec. 31, 2002; Scheuerlein et al., U.S. application Ser. No. 10/335078, "Programmable Memory Array Structure Incorporating Series-Connected Transistor Strings and Methods for Fabrication and Operation of Same," filed Dec. 31, 2002; and Vyvoda, U.S. patent application Ser. No. 10/440882, "Rail Schottky Device and Method of Making", filed May 19, 2003, all assigned to the assignee of the present invention and hereby incorporated by reference.

A monolithic three dimensional memory array is one in which multiple memory levels are formed above a single substrate, such as a wafer, with no intervening substrates. In contrast, stacked memories have been constructed by forming memory levels on separate substrates and adhering the memory levels atop each other, as in Leedy, U.S. Pat. No. 5,915,167, "Three dimensional structure memory." The substrates may be thinned or removed from the memory levels before bonding, but as the memory levels are initially formed over separate substrates, such memories are not true monolithic three dimensional memory arrays.

In some of these memory arrays, for example the array of Scheuerlein et al., the memory cells are charge storage memory cells, like SONOS or floating gate devices. In others, such as Herner et al., the memory cells are write-once memory cells, for example a paired antifuse and diode, the cell in one programmed state before the antifuse is ruptured, and in another programmed state after.

In embodiments of these monolithic three dimensional memory arrays, dense memory lines must be electrically connected to underlying or overlying interconnect layers. These interconnect levels may sometimes be shared, and need not be as dense as the memory levels. In a repeating pattern, such as a line-and-space pattern, pitch is the distance from one point in the pattern to the next occurrence of the same point: the distance from the center of one line to the center of the adjacent line, for example. It is advantageous for the memory to be as dense as possible, with the tightest possible pitch. Since interconnect layers need not be as dense, it is preferable to form them more widely spaced, formed at a lower pitch, using cheaper lithography tools and photomasks and lowering the overall cost of the integrated circuit.

Difficulties are encountered, however, when trying to electrically connect a level formed at a small pitch to a level formed at a larger pitch.

Figure 2:
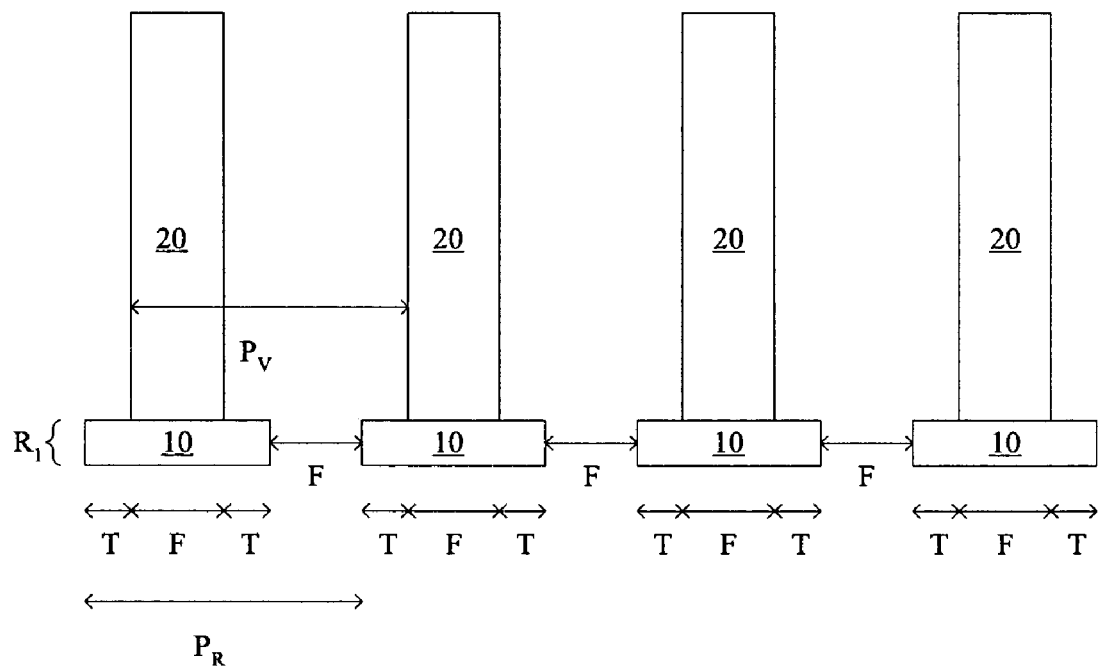
FIG. 2 is a cross-section illustrating relative pitch of vias and routing level when the vias all attach to a single routing level.

Turning to FIG. 2, it is usual for the region where a via makes contact to a routing level $R_1$ to be a pad which is larger than the minimum feature size F for routing level $R_1$. (The minimum feature size is the smallest patterned feature or patterned gap that can be formed using given photolithography equipment.) The purpose of the pad is to avoid misalignment and to maximize contact area (thus minimizing resistance.) The pad 10 is typically larger than the feature size on all sides by a tolerance T, which is normally about ½ F. The gap between pads 10 cannot be less than F, the minimum feature size.

It will be seen that the pitch is $P_R$ for the routing level $R_1$. Since there is a one-to-one correspondence between vias 20 and routing level $R_1$ pads 10, it will be seen that the via pitch $P_V$ is identical to routing level pitch $P_R$. In this case $P_V=P_R=(T+F+T+F)=3F$, assuming T is ½ F.

Figure 3:
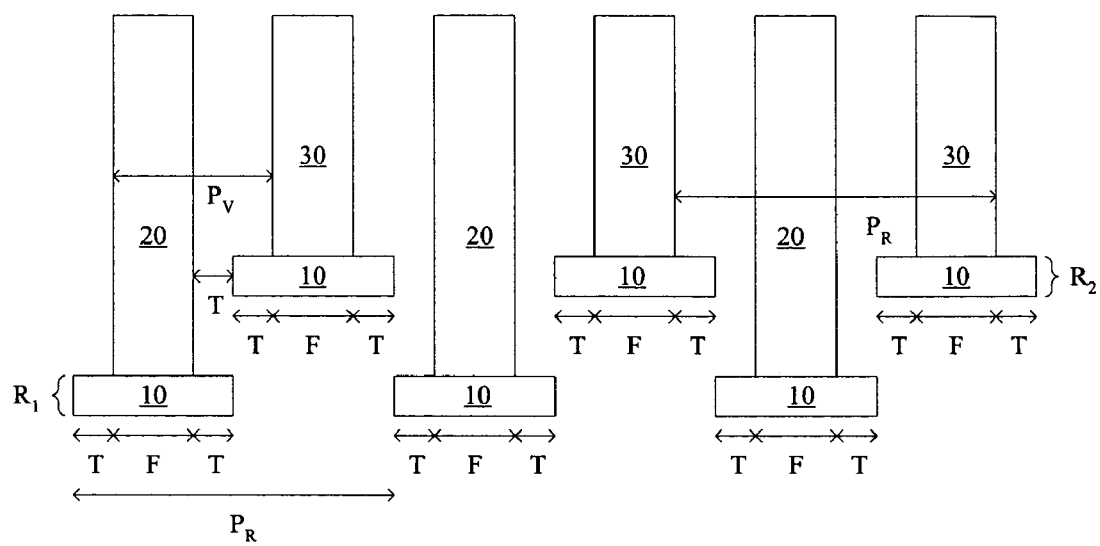
FIG. 3. is a cross-section of vias and staggered routing levels according to the present invention, staggered routing levels formed below the vias.

FIG. 3 shows an alternative arrangement according to the present invention. Instead of a single routing level $R_1$, there are two routing levels, $R_1$ and $R_2$, formed at different heights. In this drawing, vias 20 connect to routing level $R_1$, while vias 30 connect to routing level $R_2$. Vias 20 alternate with vias 30 and are vertically overlapping. Two or more vias are considered to be "vertically overlapping" when some portion of each of the vias excluding the routing levels exist at substantially the same height above the substrate. Since pads 10 connecting to adjacent vias 20 and 30 are no longer at the same level, it is not necessary for a space of feature size F to exist between them. It will be seen that with routing levels $R_1$ and $R_2$ at different heights, via pitch $P_V$ can be significantly smaller than in FIG. 2. A tolerance should be maintained between vias 20 and adjacent pads 10. This tolerance is not exactly the same as T, since it has a slightly different physical requirement (T' must be adequate to maintain a minimum dielectric thickness between the contact and the neighboring pad), but is similar, and will be referred to as T'; this discussion assumes that T and T' are about the same. Thus assuming vias 20 and vias 30 have a feature size of about F, the routing level minimum feature size, and assuming T (and T') is about ½ F, via pitch $P_V$ is about F+T+T', or about 2F. This is a 3:2 improvement in via pitch $P_V$ over the arrangement shown in FIG. 2.

This example showed vias connecting to routing levels $R_1$ and $R_2$, where $R_1$ and $R_2$ are formed below vias 20 and 30, and where the pitch of routing levels $R_1$ and $R_2$ is larger than the pitch of the structures above them. This is in contrast to the usual trend in integrated circuits, in which pitch is progressively more relaxed the higher a level is formed above the substrate, normally a semiconductor wafer. Such an arrangement is advantageous when, for example, vias 20 and 30 are connecting to memory lines in a memory array, the memory array formed over a device level formed in the substrate, the substrate device level including, for example, CMOS circuits formed in the substrate, when the substrate device level is formed at a larger pitch than the memory array. Such an arrangement is fully described in the related application of Cleeves et al., filed on even date herewith. Routing levels $R_1$ and $R_2$ of this example are advantageously formed below the memory array and above the substrate, where connectivity from routing levels $R_1$ and $R_2$ to substrate circuitry is easily achieved.

Figure 4:
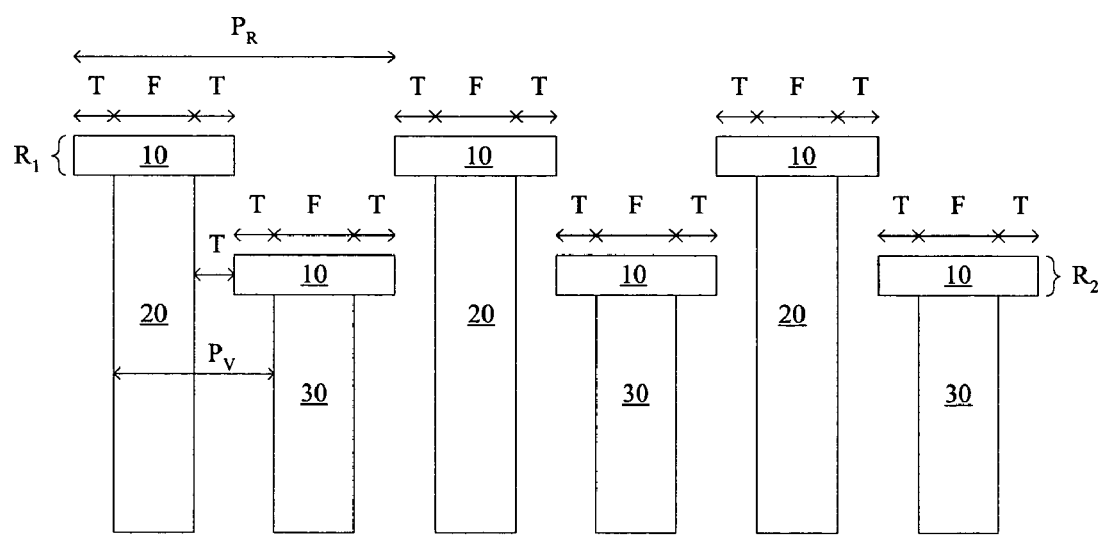
FIG. 4. is a cross-section of vias and staggered routing levels according to the present invention, staggered routing levels formed above the vias.

The staggered routing levels of the present invention would also provide advantage in a more conventional integrated circuit in which pitch increases in levels formed successively higher above the substrate. In this case the vias would connect to staggered routing levels $R_1$ and $R_2$ formed above the vertically overlapping vias, as in FIG. 4.

A detailed example will be provided of vias connecting memory lines in a monolithic three dimensional memory array to staggered routing levels below the array, the vias and routing levels formed according to the present invention. Further information will be provided as to advantageous methods and materials which are used to fabricate such an array. As will be apparent to those skilled in the art, this detailed example is just one of many possible embodiments of the present invention. The arrangement and placement of the vias and staggered routing levels, the circuits they serve to interconnect, and many details of their formation and use can be widely varied while the result still falls within the scope of the invention.

Structure

In general, the monolithic three dimensional memory arrays described in the incorporated applications and patents describe dense memory arrays comprising memory cells of various types, some rewritable, others write-once. The vias and staggered routing levels according to the present invention could be used with any of these monolithic three dimensional memory arrays. Two will be selected for particular discussion.

In the rewritable memories of Scheuerlein et al., memory cells are charge storage memory cells, for example SONOS or floating gate devices. In such array, lines in one dimension are channel bodies arranged in a NAND series string; substantially perpendicular to these are control gate electrodes.

Alternatively, as in the memory of Hemer et al., the array can be a passive element memory array. In such an array, the lines comprise conductors. At the intersections of the conductors are passive element memory cells. As used herein, a passive element memory array includes a plurality of two-terminal memory cells, each connected between an associated X-line and an associated Y-line. Such a memory array may be planar or may be a three-dimensional array having more than one plane of memory cells. Each such memory cell has a non-linear conductivity in which the current in a reverse direction (i.e., from cathode to anode) is lower than the current in a forward direction. Application of a voltage from anode to cathode greater than a programming level changes the conductivity of the memory cell. The conductivity may increase when the memory cell incorporates a fuse technology, or may decrease when the memory cell incorporates an antifuse technology. A passive element memory array is not necessarily a one-time programmable (i.e., write once) memory array.

Thus lines in a monolithic three dimensional memory array may be, for example, the NAND strings of Scheuerlein et al. or the conductors (or bitlines) of Herner et al. In either case, these lines require connection to vias which in turn connect to support circuitry. Connections of the lines to vias are advantageously arranged as in FIG. 5, which shows a level of memory in plan view. In this level, memory lines have a first pitch $P_M$. Adjacent memory lines, such as lines 202 and 204, are interleaved, connecting to vias at opposite ends; i.e. line 202 connects to via 210, while line 204 connects to via 218. Memory lines on opposite sides of the same via, for example lines 202 and 203 on opposite sides of via 210, share the via. Vias are arranged in rows, here rows 220 (including vias 208, 210, 212, and 214) and 230, each row having a via pitch $P_V$. The combination of interleaving lines and sharing vias allows every memory line to connect to a via, even though the memory pitch $P_M$ is significantly smaller than the via pitch $P_V$.

Figure 5:
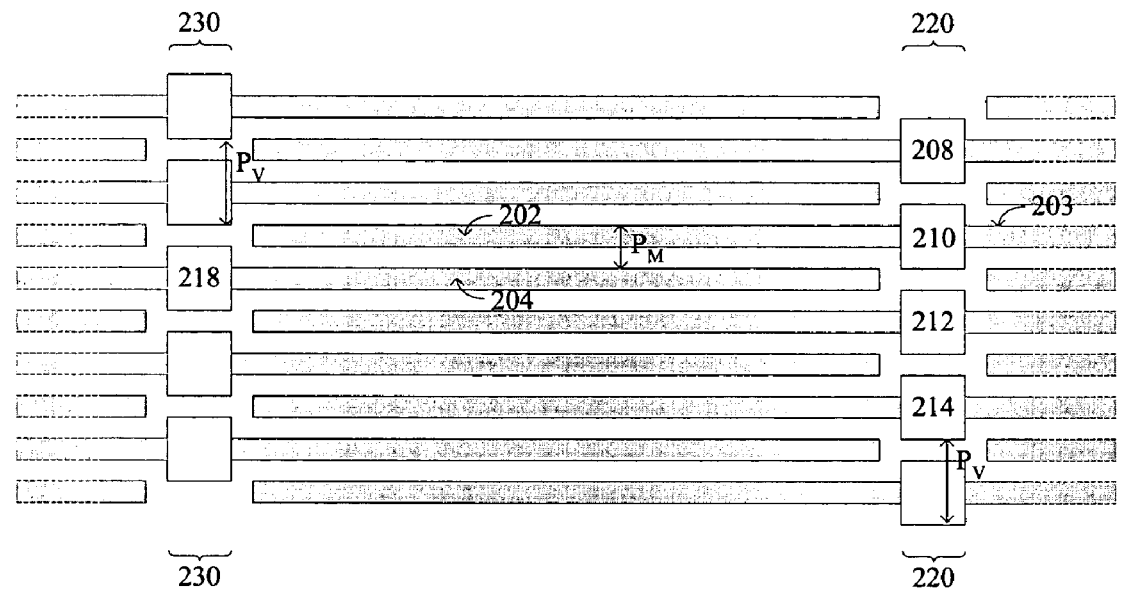
FIG. 5 is a plan view of a memory level with memory lines connected to vias according to the present invention.
Figure 6:
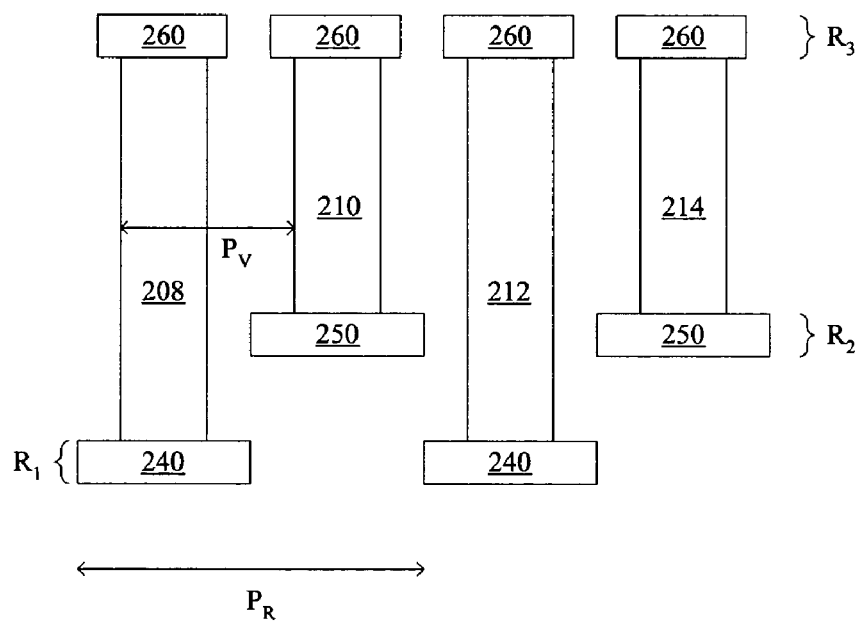
FIG. 6 is a cross-section of vias shown FIG. 5, their attachment to staggered routing levels illustrated.

FIG. 6 shows vertically overlapping vias 208, 210, 212, and 214 from FIG. 5 in cross-section. These vias connect at their bottom ends to staggered routing levels $R_1$ and $R_2$ according to the present invention, to pads 240 for routing level $R_1$ and to pads 250 for routing level $R_2$. At their top ends they connect to routing level $R_3$ at pads 260. As shown in FIG. 5, routing level $R_3$ is made up of memory lines in a memory array. Routing level $R_3$ is formed above the vias, vertically opposite the first and second routing levels.

Note that the minimum feature size in the memory level shown in FIG. 5 is significantly smaller than the minimum feature size in routing levels $R_1$ and $R_2$ of FIG. 6. It is assumed that cheaper lithography tools and cheaper photomasks are used to form levels $R_1$ and $R_2$ than to form the dense memory lines of FIG. 5, reducing overall die cost. Thus the memory level pads 260 can be smaller than the routing level $R_1$ and $R_2$ memory level pads 240 and 250, as can the gap separating them.

Figure 7:
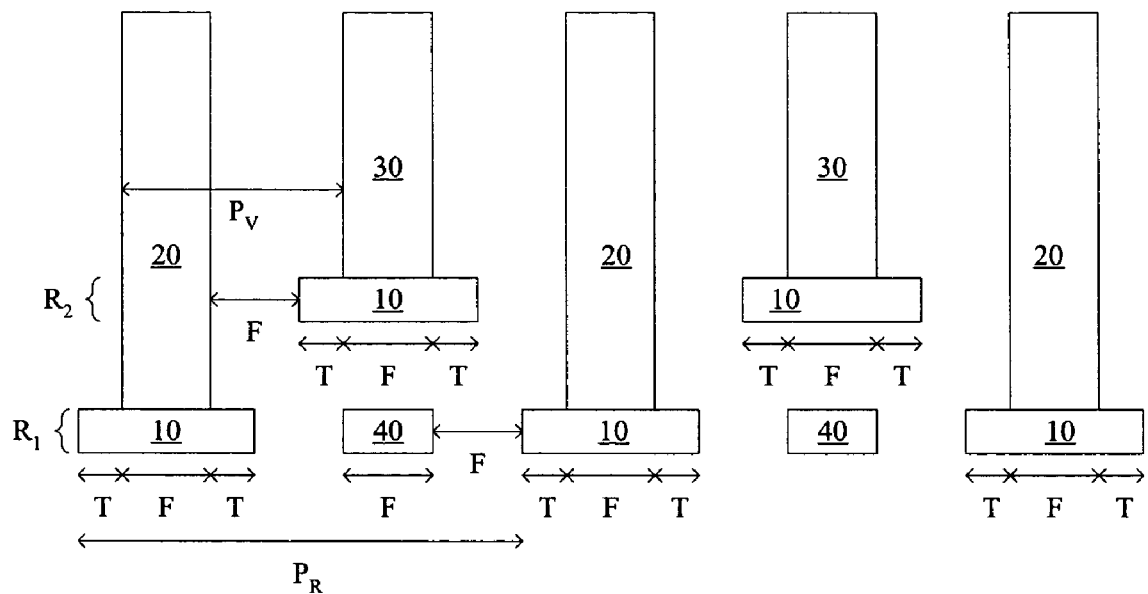
FIG. 7 is a cross-section showing the use of passing lines at the height of the first routing level.

Turning to FIG. 7, additional connectivity, for example to circuitry formed in the substrate, can be provided by forming passing lines 40 between routing level $R_1$ pads 10. These lines can be formed at the minimum feature size F and with a gap of minimum feature size F separating them from pads 10. If passing lines are used, via pitch $P_V$ will be about 2.5 times the minimum feature size F.

Fabrication

The structures described above having vias connected to staggered routing levels can be formed using any methods known in the art. A detail description of preferred methods to form embodiments of the present invention will be provided.

Figure 8A:
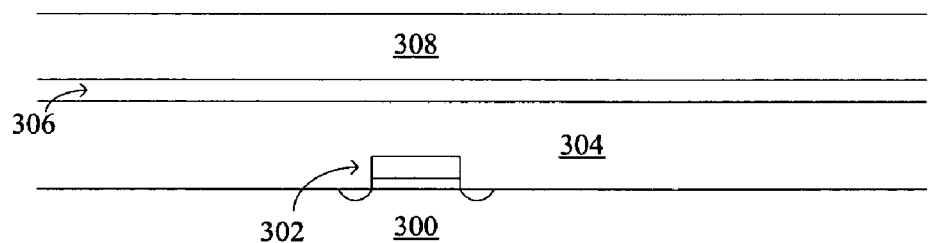
FIGS. 8a through 8f are cross-sections illustrating fabrication of vias and staggered routing levels according to the present invention.

BOTTOM ROUTING LEVELS, SINGLE ETCH AND FILL: As noted, the staggered routing levels may be above the vertically overlapping vias or below them. Either style preferably begins with a suitable substrate 300, typically a monocrystalline silicon wafer, shown in cross-section in FIG. 8a. In preferred embodiments, support circuitry, for example CMOS circuit 302, is fabricated in the substrate. The substrate circuits are isolated with dielectric 304, for example silicon dioxide, then a conductive layer or layers are formed on dielectric 304. In the example shown, layer 306 is TiN and layer 308 is tungsten. Tungsten layer 308 will form the bulk of the first routing level, and TiN acts as an adhesion layer. Many other materials can be used, and layers 306 and 308 can be replaced with one, two, or more layers.

Figure 8B:
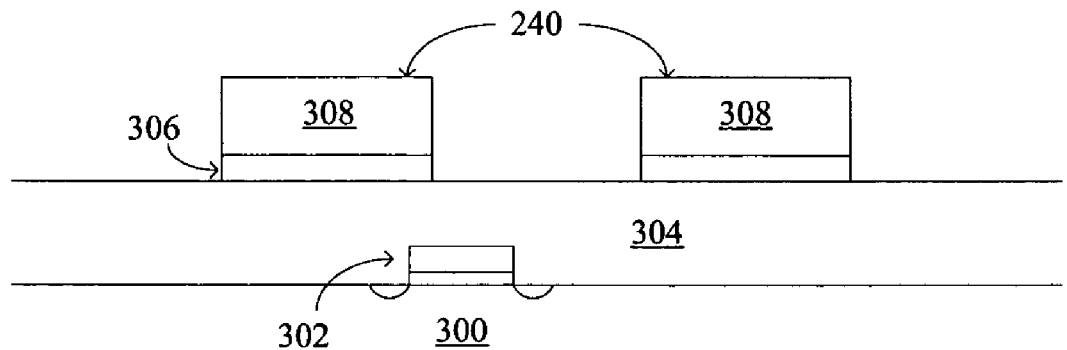
Figure 8C:
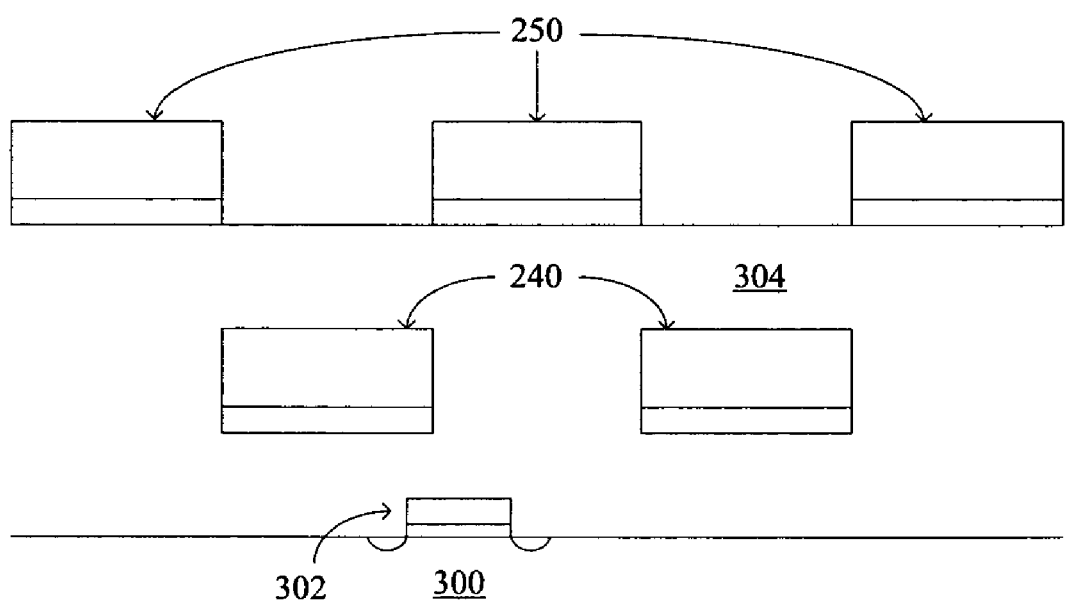

As shown in FIG. 8b, layers 308 and 306 are patterned and etched to form first routing level pads 240. If passing lines are being formed, they will be patterned and etched at the same time. In FIG. 8c, dielectric material 304 fills the spaces between pads 240 and covers them to a second height and is planarized, for example by etchback or chemical mechanical polishing. Conductive materials are deposited, patterned and etched in the same manner as pads 240 to form second routing levels pads 250.

Figure 8D:
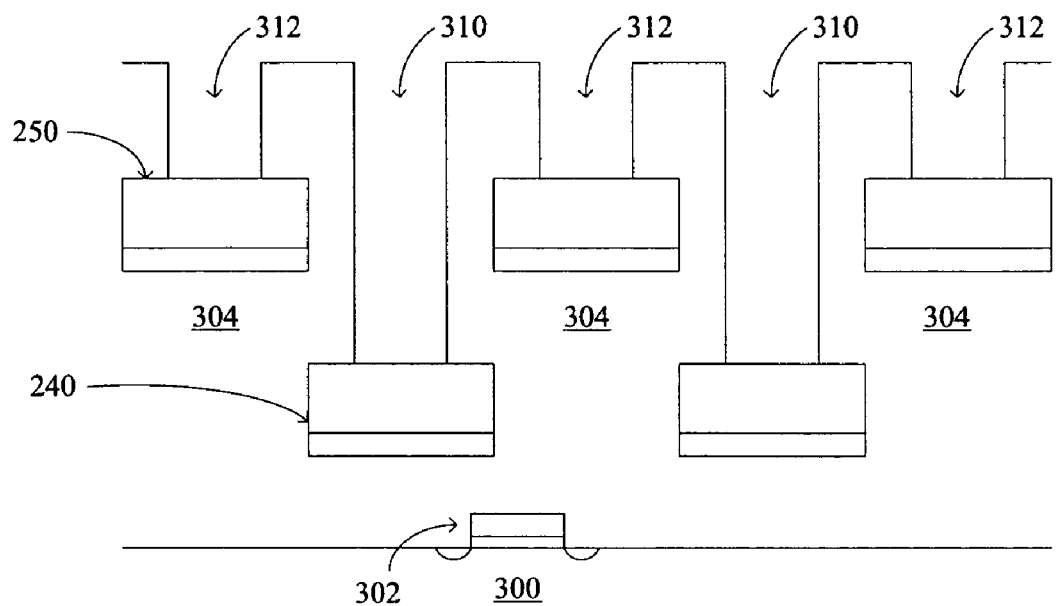

Next memory levels are constructed. As each level is constructed, more dielectric 304 is deposited to isolate structures, and is planarized after each deposition. Turning to FIG. 8d, when a memory level is to be formed that is intended to be connected by vias to first routing level pads 240 and second routing level pads 250, fabrication of that memory level begins by patterning and etching via holes 310 and 312. Via holes 310 reach to first routing level pads 240, while via holes 312 are shallower, reaching only to second routing level pads 250. It will be recalled that a preferred material for dielectric 304 is silicon dioxide, while the preferred material forming the top of pads 240 and 250 was tungsten (layer 308 in FIG. 8a.) Silicon dioxide and tungsten are advantageous choices in that they have very good etch selectivity; i.e. etchants are available that will etch silicon dioxide at a much higher rate than tungsten. It is important to select materials for these layers for good etch selectivity, since the etch of shallower via holes 312 must be relied on to substantially stop while the etch of deeper via holes 310 continues.

Figure 8E:
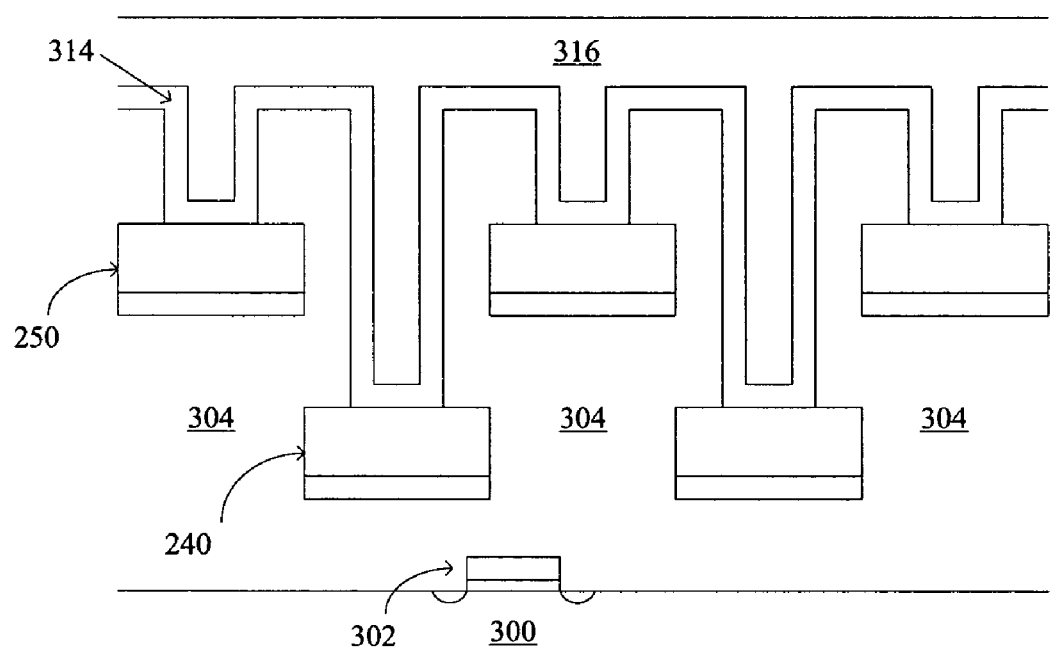
Figure 8F:
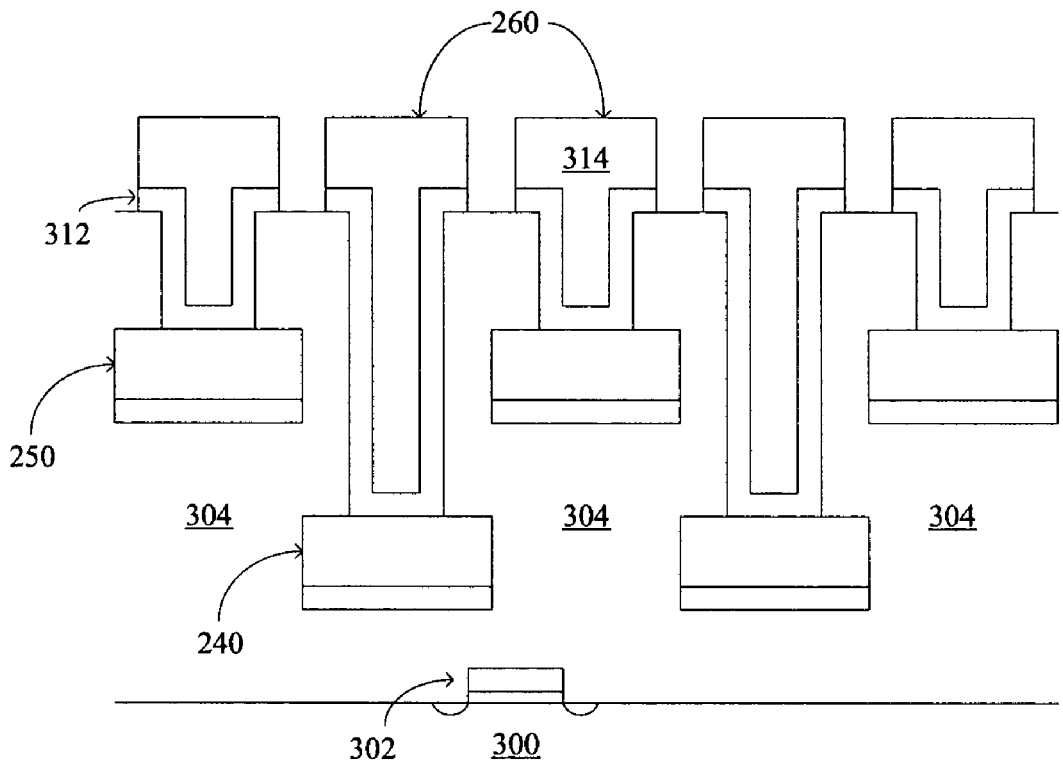

Turning to FIG. 8e, in this exemplary embodiment a conformal layer of TiN 314 is deposited lining via holes 310 and 312 and forming a thin layer of TiN on dielectric 304. Conductive layer 316, for example of tungsten, is deposited on layer 314, filling via holes 310 and 312 (not shown, as they are now filled) and forming a conductive layer at the memory level. As shown in FIG. 8f, layers 314 and 312 are patterned and etched to form memory level pads 260. Memory lines in the memory level can be formed in the same patterning and etch steps that form pads 260. Pads 240, 250, and 260 of FIGS. 8b through 8f correspond to pads 240, 250, and 260 of FIG. 6.

In this example, the first, deeper vias were connected at bottom ends to the first routing level (pads 240), and the second, shallower vias were connected at bottom ends to the second routing level (pads 250.) The first via holes 310 and second via holes 312 were etched in the same etch process, and the first via holes 310 and second via holes 312 were filled at substantially the same time.

Figure 9A:
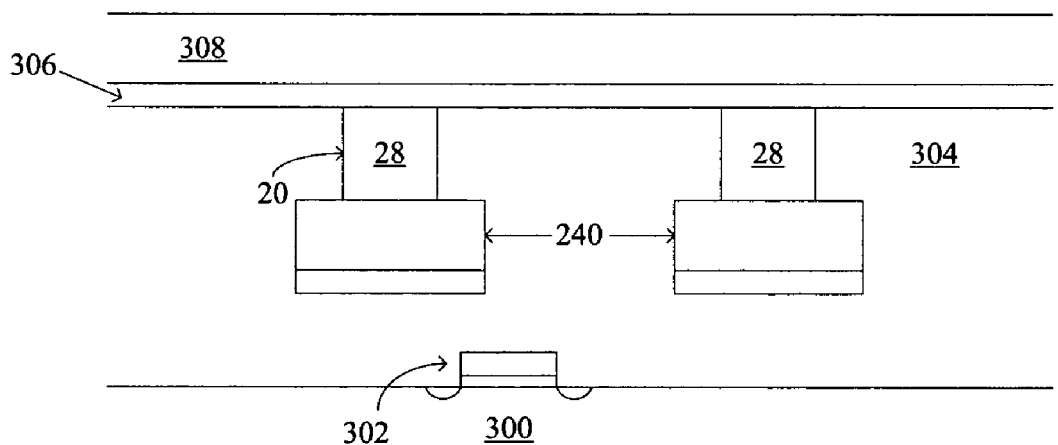
FIGS. 9a through 9c are cross-sections illustrating an alternate method of fabrication of vias and staggered routing levels according to the present invention.

BOTTOM ROUTING LEVELS, SPLIT ETCHES AND FILLS: As those skilled in the art will appreciate, many other fabrication methods and materials can be used to form the via and staggered routing level structure of FIG. 8f while still falling within the scope of the present invention. For example, turning to FIG. 9a, first routing level pads 240 can be formed as described previously. Next dielectric fill 304 is deposited to the height of the second routing level, then etched to form bottom portions of vias holes reaching to first routing level pads 240. The via holes are filled with conductive material 28, preferably doped polycrystalline silicon, herein called polysilicon, forming bottom portions of vias 20. After planarization, conductive material, preferably titanium nitride 306 and tungsten 308, is deposited on dielectric fill 304 and bottom portions of vias 20. The resulting structure is shown in FIG. 9a.

Figure 9B:
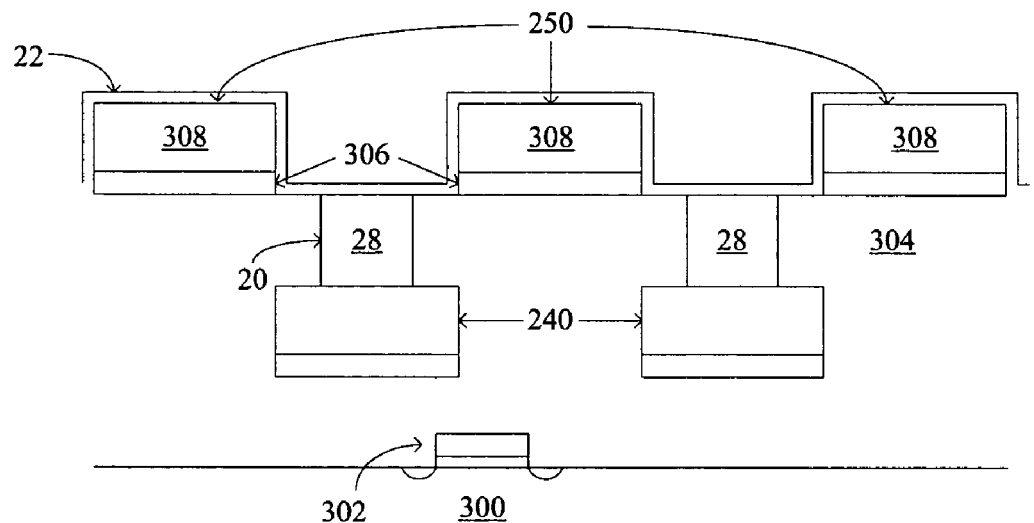

As shown in FIG. 9b, layers 306 and 308 are patterned and etched to form second routing level pads 250. A thin etch stop layer 22, for example silicon nitride, is formed over and between pads 250.

Figure 9C:
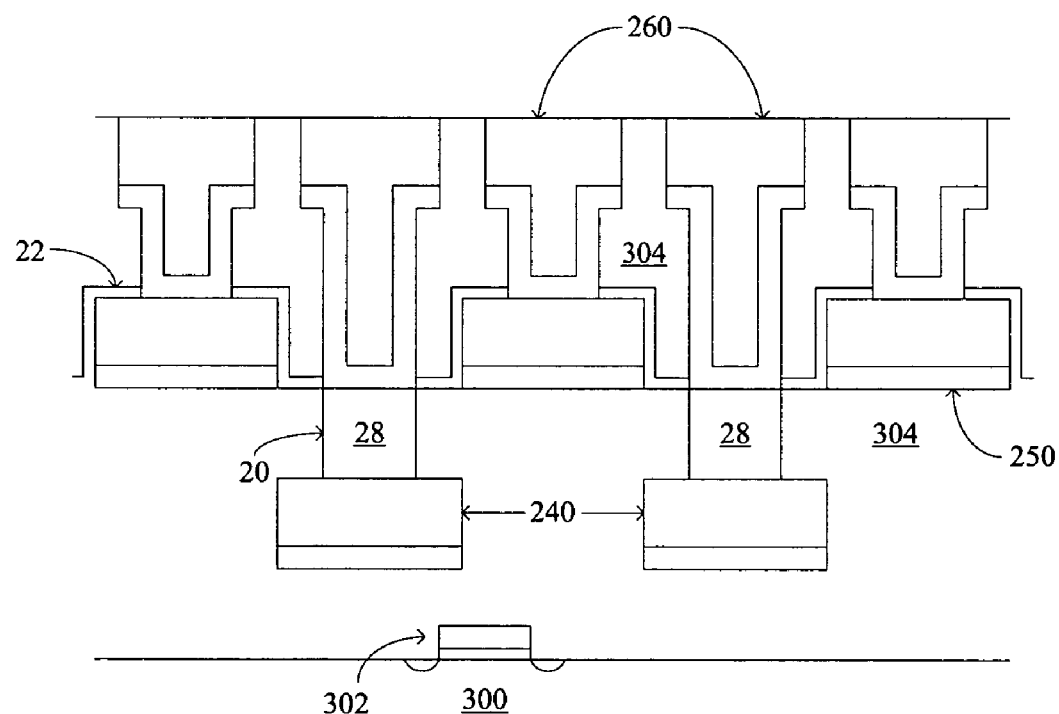

Dielectric fill 304 is deposited between and over pads 250 and etch stop layer 22. Memory levels are constructed. As each level is constructed, more dielectric fill 304 is deposited to isolate structures, and is planarized after each deposition. When a memory level is to be formed that is intended to connect by vias to first routing level pads 240 and second routing level pads 250, via holes reaching to second routing level pads 250 and the tops of vias 20 are patterned and etched. Via holes are etched using a two-step etch process. First a silicon dioxide etch forms the via holes and stops on silicon nitride etch stop layer 22. Next silicon nitride etch stop layer 22 is etched, stopping on the silicon 28 of vias 20 and, in the case of any misalignment, silicon dioxide fill 304, and the tungsten of pads 250. Conductive material, preferably a layer of titanium nitride and a layer of tungsten, is deposited, filling top portions of the via holes and forming a layer above the dielectric, which is then patterned and etched to form third routing level pads 260. The gaps between pads 260 are filled with dielectric fill 304, as shown in FIG. 9c.

In this example, the first, deeper vias were connected at bottom ends to the first routing level (pads 240), and the second, shallower vias were connected at bottom ends to the second routing level (pads 250.) The top portions of the deeper via holes and the shallower via holes were etched in the same etch process. The top portions of the deeper vias holes and the shallower via holes were filled at substantially the same time. Compared to previous embodiments, this embodiment requires an extra masking step and an extra contact fill process, but has less stringent etch selectivity requirements.

Figure 10A:
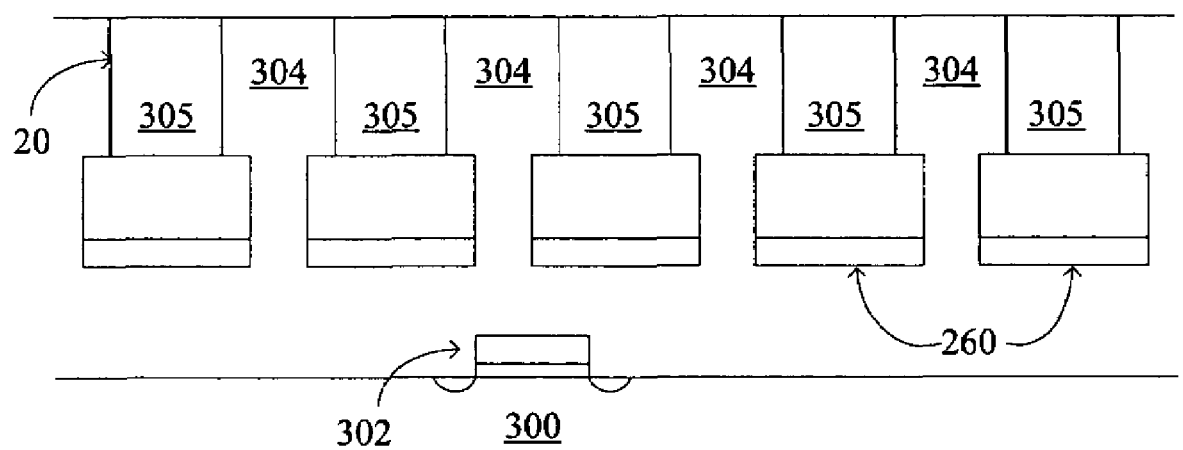
FIGS. 10a through 10d are cross-sections illustrating fabrication of vias and staggered routing levels according to the present invention with the staggered routing levels formed above the vias.
Figure 10B:
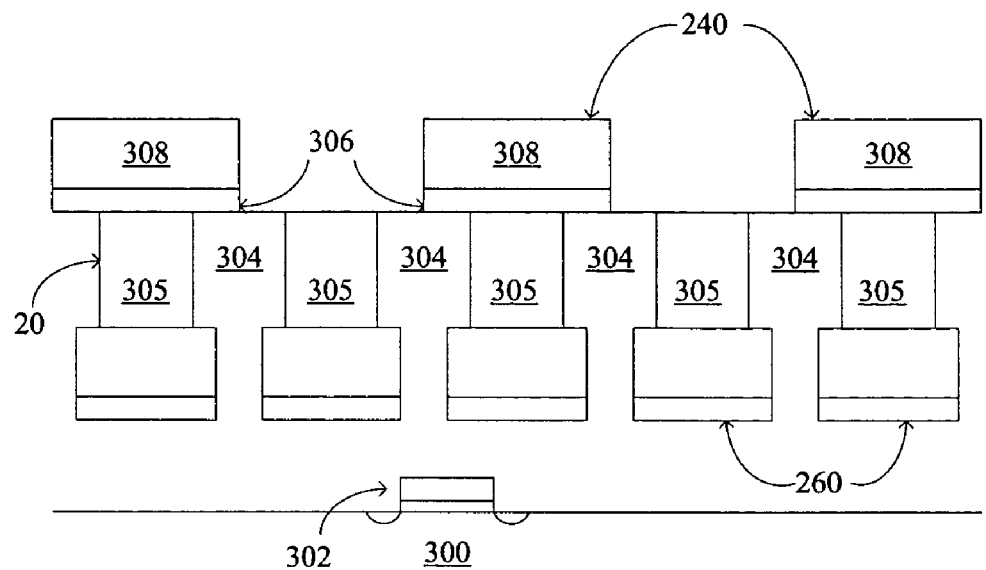

TOP ROUTING LEVELS, SPLIT ETCHES AND FILLS: Various fabrication methods can be used to form vias for embodiments in which the staggered routing levels attach to top ends of the vias, as in FIG. 4. Examples will be given of a method to form vias attaching to staggered first and second routing levels formed above the vias, and, at opposite ends of the vias, to a third routing level formed below the vias. As described earlier, the third routing level may comprise memory lines in a memory array. Turning to FIG. 10a, pads 260 formed at a common routing level at the bottom portions of vias are formed first. Dielectric fill 304 is filled to the height where the first routing level is to be formed and is planarized. Via holes are etched and filled with conductive material, for example polysilicon 305. Vias that will reach to the first routing level have now been formed, along with bottom portions of vias that will reach to the second routing level. As shown in FIG. 10b, a conductive material or materials, preferably titanium nitride 306 and tungsten 308, are deposited and first routing level pads 240 are patterned and etched. The titanium nitride etch should be carefully controlled to stop when it reaches polysilicon 305; some overetch can be tolerated.

Figure 10C:
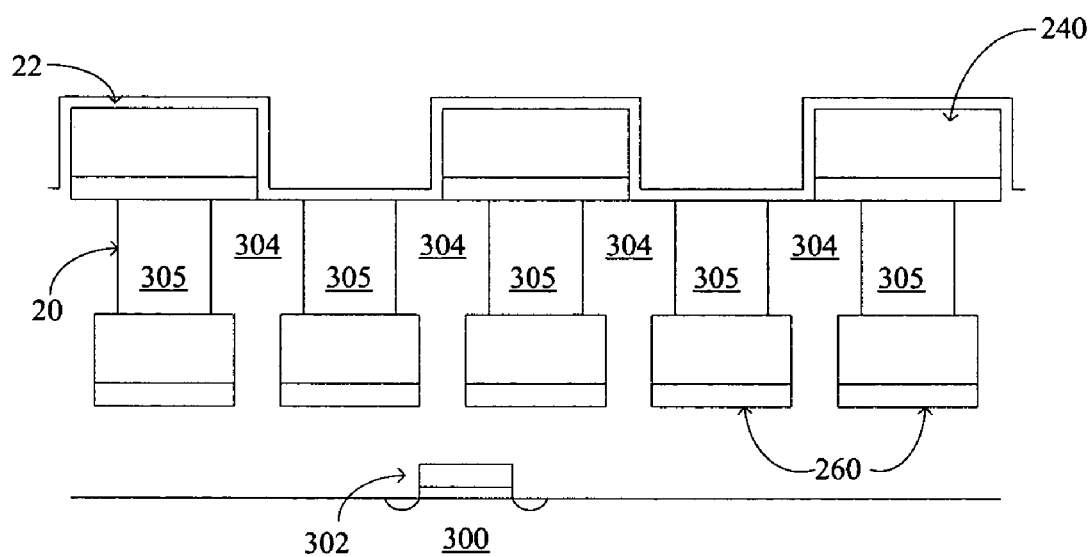

Next, as shown in FIG. 10c, a thin etch stop layer 22, for example silicon nitride, is formed over and between pads 240.

As an alternative, if the thermal budget permits its use, aluminum can be substituted for tungsten in pads 240. In this case, titanium nitride and tungsten can be used in place of polysilicon 305. This may be particularly advantageous, for example, in logic or memory arrays which are formed in the substrate.

Figure 10D:
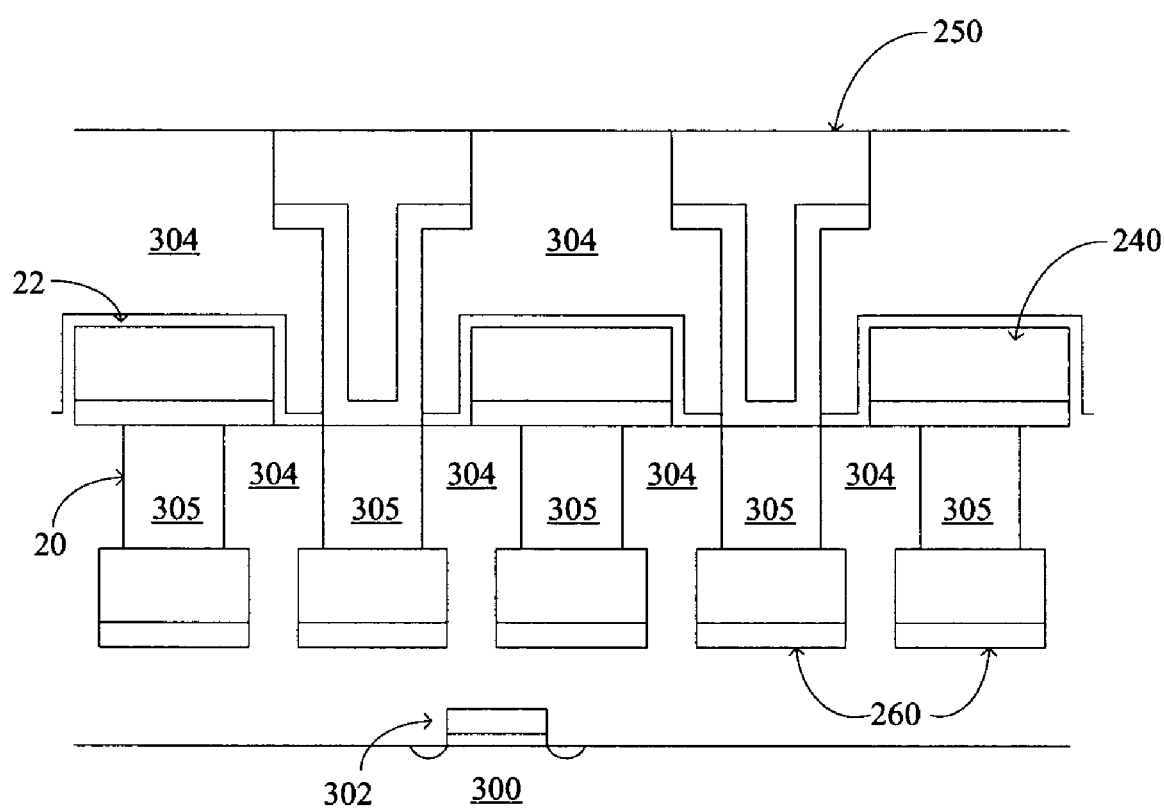

Turning to FIG. 10d, dielectric fill 304 is deposited between and over pads 240, filling to the height at which the second routing level will be formed. Via holes are etched using a two-step etch process. First a silicon dioxide etch forms the via holes and stops on silicon nitride etch stop layer 22. Next silicon nitride etch stop layer 22 is etched, stopping on the silicon of vias 20 and, in the case of misalignment, silicon dioxide fill 304.

Conductive material, preferably a layer of titanium nitride and a layer of tungsten, is deposited, filling top portions of the via holes and forming a layer above the dielectric, which is then patterned and etched to form second routing level pads 250. Gaps between pads 250 are filled with dielectric 304, creating structure shown in FIG. 10d.

In this example, first vias were connected at top ends to the first routing level (pads 240), and second vias were connected at top ends to the second routing level (pads 250.) The bottom portions of the first via holes and the second via holes were etched in the same etch process. The bottom portions of first via holes and the second via holes were filled at substantially the same time.

Figure 11A:
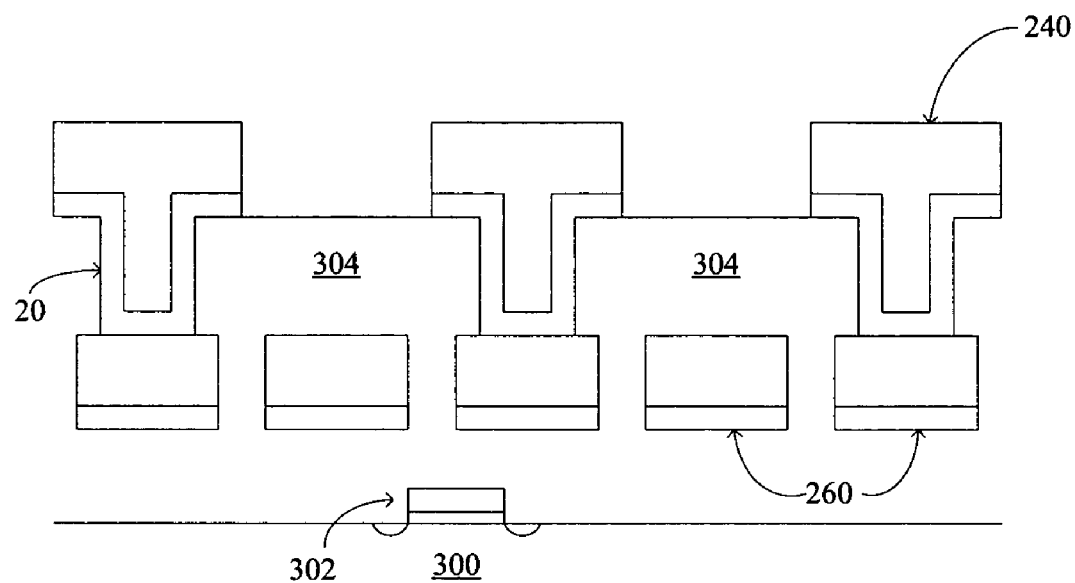
FIGS. 11a and 11b are cross-sections illustrating an alternate method of fabrication of vias and staggered routing levels according to the present invention with the staggered routing levels formed above the vias.

TOP ROUTING LEVELS, SEPARATE ETCHES AND FILLS: As an alternative, when the staggered routing levels are formed above the vias, it may be desirable to form the vias connected to the first routing level and the vias connected to the second routing level completely independently. In this method, pads 260 at a common routing level are formed first. Next dielectric fill 304 is deposited to the height of the first routing level and planarized. Via holes are patterned and etched only for the vias that will connect to the first routing level, then conductive material is deposited, patterned and etched to form first vias 20 and first routing level pads 240. The structure at this point is shown in FIG. 11a.

Figure 11B:
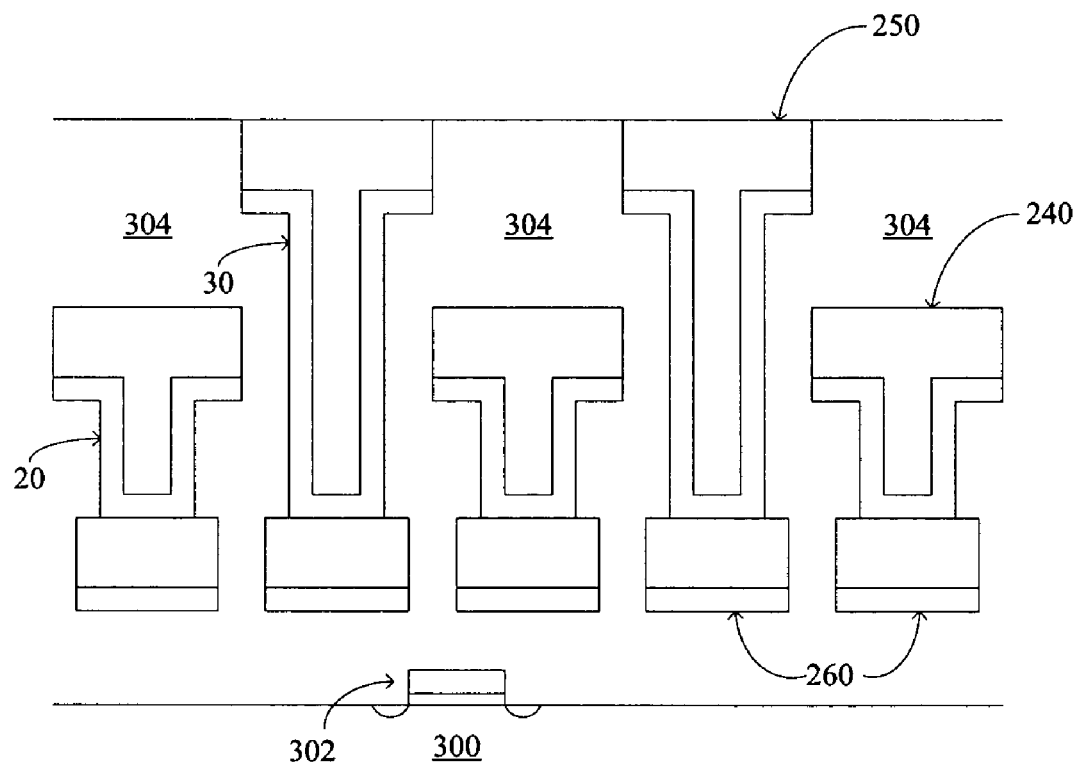

Next dielectric fill 304 is deposited to the height of the second routing level and planarized. Via holes are patterned and etched only for the vias that will connect to the second routing level, then conductive material is deposited, patterned and etched to form second vias 30 and second routing level pads 250. The gaps between second routing level pads 250 are filled by dielectric 304. The resulting structure is shown in FIG. 11*b*.

In this example, first vias 20 were connected at top ends to the first routing level (pads 240), and second vias 30 were connected at top ends to the second routing level (pads 250.) The first via holes and the second via holes were etched in separate etch processes, and the first via holes and second via holes were filled at different times.

The foregoing detailed description has described only a few of the many forms that this invention can take. For this reason, this detailed description is intended by way of illustration, and not by way of limitation. It is only the following claims, including all equivalents, which are intended to define the scope of this invention.

What is claimed is:

1. A structure for providing multilevel electrical connectivity within an integrated circuit, the structure comprising:
    a first plurality of vias, each having a top end and a bottom end;
    a second plurality of vias, each having a top end and a bottom end, wherein the first and second pluralities of vias are vertically overlapping;
    a first routing level at a first height, said first level connected to the first plurality of vias at the bottom end of each first via; and
    a second routing level at a second height, said second level connected to the second plurality of vias at the bottom end of each second via, wherein the first height is different from the second height,
    wherein both routing levels are formed above a substrate,
    wherein the first and second vias are evenly spaced and have a common first pitch,
    and further comprising a third routing level, the third routing level above the first and second vias connected at the top end of each first and second via,
    vertically opposite the first and second routing levels,
    wherein the third routing level comprises memory lines in a memory array, and wherein the first plurality of vias are not connected to any routing level above the first routing level and below the third routing level, and wherein the second plurality of vias are not connected to any routing level above the second routing level and below the third routing level.

2. The structure of claim 1 wherein memory cells accessed by the memory lines are charge storage memory cells.

3. The structure of claim 2 wherein the memory cells are SONOS devices.

4. The structure of claim 2 wherein the memory cells are floating gate devices.

5. The structure of claim 2 wherein the memory cells are arranged in a NAND string.

6. The structure of claim 1 wherein memory cells accessed by the memory lines are passive element memory cells.

7. The structure of claim 6 wherein at least one passive element memory cell comprises an antifuse.

8. The structure of claim 6 wherein at least one passive element memory cell comprises a fuse.

9. The structure of claim 1 wherein the memory array is a monolithic three dimensional memory array.

10. The structure of claim 1 wherein the array is a monolithic three dimensional memory array comprising at least first and second memory levels, the second memory level formed vertically above the first memory level.

11. A structure for providing multilevel electrical connectivity within an integrated circuit, the structure comprising:
    a first plurality of vias, each having a top end and a bottom end;
    a second plurality of vias, each having a top end and a bottom end, wherein the first and second pluralities of vias are vertically overlapping;
    a first routing level at a first height, said first level connected to the first plurality of vias at the bottom end of each first via;
    a second routing level at a second height, said second level connected to the second plurality of vias at the bottom end of each second via, wherein the first height is different from the second height; and
    a third routing level at a third height, the third level connected to the first plurality of vias and to the second plurality of vias at the top end of each first and second via, wherein all three routing levels are formed above a substrate,
    wherein the first and second vias are evenly spaced and have a first pitch, wherein the third routing level comprises memory lines in a memory array, and
    wherein the first plurality of vias are not connected to any routing level above the first routing level and below the third routing level, and wherein the second plurality of vias are not connected to any routing level above the second routing level and below the third routing level.

12. The structure of claim 11 wherein the first routing level has a second pitch, the second routing level has a third pitch, the first pitch smaller than the second pitch and the third pitch.

13. The structure of claim 12 wherein memory cells accessed by the memory lines are charge storage memory cells.

14. The structure of claim 13 wherein the memory cells are SONOS devices.

15. The structure of claim 13 wherein the memory cells are floating gate devices.

16. The structure of claim 13 wherein the memory cells are arranged in a NAND string.

17. The structure of claim 12 wherein memory cells accessed by the memory lines are passive element memory cells.

18. The structure of claim 17 wherein at least one passive element memory cell comprises an antifuse.

19. The structure of claim 17 wherein at least one passive element memory cell comprises a fuse.

20. The structure of claim 11 wherein the memory array is a monolithic three dimensional memory array.

21. The structure of claim 11 wherein the memory lines have a fourth pitch smaller than the first pitch.

22. A structure for providing multilevel electrical connectivity within a memory array, the structure comprising:
    a first plurality of vias, each having a top end and a bottom end;
    a second plurality of vias, each having a top end and a bottom end, wherein the first and second pluralities of vias are vertically overlapping;
    a first routing level at a first height, said first level connected to the first plurality of vias at the top end or the bottom end of each first via;
    a second routing level at a second height, said second level connected to the second plurality of vias at the top end or bottom end of each second via, wherein the first height is different from the second height; and a third routing level at a third height, the third level connected to the first plurality of vias and to the second plurality of vias at the top end or the bottom end of each first or second via, vertically opposite the first or second routing level, where all three routing levels are formed above a substrate, wherein the first and second vias are evenly spaced and have a first pitch, wherein the array is a monolithic three dimensional memory array comprising at least first and second memory levels, the second memory level formed vertically above the first memory level, and wherein the first plurality of vias are not connected to any routing level vertically between the first routing level and the third routing level, and wherein the second plurality of vias are not connected to any routing level vertically between the second routing level and the third routing level.

23. A structure for providing multilevel electrical connectivity within an integrated circuit, the structure comprising:
a first plurality of vias, each having a top end and a bottom end;
a second plurality of vias, each having a top end and a bottom end;
a first routing level at a first height, said first level connected to the first plurality of vias at the bottom end of each first via;
a second routing level at a second height, said second level connected to the second plurality of vias at the bottom end of each second via, wherein the first height is different from the second height; and
a third routing level at a third height, the third level connected to the first plurality of vias and to the second plurality of vias at the top end of each first and second via, wherein all three routing levels are formed above a substrate,
wherein the first and second vias are evenly spaced and have a first pitch, wherein the third routing level comprises memory lines in a memory array, and
wherein the first plurality of vias are not connected to any routing level above the first routing level and below the third routing level, and wherein the second plurality of vias are not connected to any routing level above the second routing level and below the third routing level.

24. The structure of claim 23 wherein the first routing level has a second pitch, the second routing level has a third pitch, the first pitch smaller than the second pitch and the third pitch.

25. The structure of claim 24 wherein memory cells accessed by the memory lines are charge storage memory cells.

26. The structure of claim 25 wherein the memory cells are SONOS devices.

27. The structure of claim 25 wherein the memory cells are floating gate devices.

28. The structure of claim 25 wherein the memory cells are arranged in a NAND string.

29. The structure of claim 24 wherein memory cells accessed by the memory lines are passive element memory cells.

30. The structure of claim 29 wherein at least one passive element memory cell comprises an antifuse.

31. The structure of claim 29 wherein at least one passive element memory cell comprises a fuse.

32. The structure of claim 23 wherein the memory array is a monolithic three dimensional memory array.

33. The structure of claim 23 wherein the memory lines have a fourth pitch smaller than the first pitch.

34. A structure for providing multilevel electrical connectivity within an integrated circuit, the structure comprising:
a first plurality of vias, each having a top end and a bottom end;
a second plurality of vias, each having a top end and a bottom end;
a first routing level at a first height, said first level connected to the first plurality of vias at the top or bottom end of each first via;
a second routing level at a second height, said second level connected to the second plurality of vias at the top or bottom end of each second via, wherein the first height is different from the second height; and
a third routing level at a third height, the third level connected to the first plurality of vias and to the second plurality of vias at the top or bottom end of each first and second via, vertically opposite the first or second routing level, wherein all three routing levels are formed above a substrate, wherein the first and second vias are evenly spaced and have a first pitch,
wherein the integrated circuit comprises a memory array,
wherein the memory array is monolithic three dimensional memory array comprising at least first and second memory levels, the second memory level formed vertically above the first memory level, and
wherein the first plurality of vias are not connected to any routing level vertically between the first routing level and the third routing level, and wherein the second plurality of vias are not connected to any routing level vertically between the second routing level and the third routing level.

35. A method for forming a via and routing structure for electrically connecting a multilevel array in an integrated circuit, the method comprising:
forming a first routing level;
forming a second routing level above the first routing level;
forming a first plurality of vias connected at bottom ends to the first routing level;
forming a second plurality of vias connected at bottom ends to the second routing level, wherein the first and second pluralities of vias are vertically overlapping,
wherein the multilevel array comprises a row of vias having a first pitch, the row of vias comprising the first plurality of vias and the second plurality of vias,
vias of the first and second pluralities interspersed,
further comprising forming a third routing level above the first and second routing levels, wherein
said third routing level connects to top ends of the first plurality of vias or
said third routing level connects to top ends of the second plurality of vias,
wherein the third routing level comprises memory lines in a memory array, and wherein the first plurality of vias are not connected to any routing level above the first routing level and below the third routing level, and where the second plurality of vias are not connected to any routing level above the second routing level and below the third routing level.

36. The method of claim 35 wherein the first routing level has a second pitch larger than the first pitch.

37. The method of claim 36 wherein the memory lines have a third pitch smaller than the first pitch.

38. The method of claim 35 wherein memory cells accessed by the memory lines are charge storage memory cells.

39. The method of claim 38 wherein the memory cells are SONOS devices.

40. The method of claim 38 wherein the memory cells are floating gate devices.

41. The method of claim 38 wherein the memory cells are arranged in a NAND string.

42. The method of claim 35 wherein the memory array is a monolithic three dimensional memory array.

43. The method of claim 35 wherein memory cells accessed by the memory lines are passive element memory cells.

44. The method of claim 43 wherein at least one passive element memory cell comprises an antifuse.

45. The method of claim 43 wherein at least one passive element memory cell comprises a fuse.

46. The structure of claim 1 wherein the memory lines have a fourth pitch smaller than the first pitch.

* * * * *